United States Patent
Pietambaram et al.

(10) Patent No.: US 9,931,820 B2
(45) Date of Patent: Apr. 3, 2018

(54) MOLD MATERIAL FOR DIRECT METALLIZATION

(71) Applicant: Intel Corporation, Santa Clara, CA (US)

(72) Inventors: Srinivas V. Pietambaram, Gilbert, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 14/977,386

(22) Filed: Dec. 21, 2015

(65) Prior Publication Data

US 2017/0173925 A1    Jun. 22, 2017

(51) Int. Cl.
| | |
|---|---|
| B32B 27/20 | (2006.01) |
| H01L 23/498 | (2006.01) |
| H01L 21/48 | (2006.01) |
| B32B 27/38 | (2006.01) |
| B32B 27/06 | (2006.01) |

(52) U.S. Cl.
CPC ............ B32B 27/20 (2013.01); B32B 27/06 (2013.01); B32B 27/38 (2013.01); H01L 21/481 (2013.01); H01L 23/49816 (2013.01); H01L 23/49822 (2013.01); B32B 2457/00 (2013.01); H01L 2224/18 (2013.01)

(58) Field of Classification Search
None
See application file for complete search history.

(56) References Cited

U.S. PATENT DOCUMENTS

| | | | | |
|---|---|---|---|---|
| 7,064,012 B1* | 6/2006 | Lin | ............ | H01L 21/4832 257/E21.175 |
| 7,094,676 B1* | 8/2006 | Leu | ............ | H01L 23/3128 257/E23.178 |
| 2007/0148467 A1* | 6/2007 | St Lawrence | .......... | B82Y 10/00 428/411.1 |
| 2012/0077401 A1* | 3/2012 | Kotake | ............ | B32B 27/38 428/221 |
| 2012/0285835 A1 | 11/2012 | Cheetham | | |
| 2013/0273731 A1 | 10/2013 | Gulpen et al. | | |

FOREIGN PATENT DOCUMENTS

| | | |
|---|---|---|
| JP | 2008273164 A | 11/2008 |
| KR | 1020140132756 A | 11/2014 |

OTHER PUBLICATIONS

"International Application Serial No. PCT/US2016/063161, International Search Report dated Mar. 13, 2017", 3 pgs.
"International Application Serial No. PCT/US2016/063161, Written Opinion dated Mar. 13, 2017", 9 pgs.

* cited by examiner

*Primary Examiner* — David Sample
*Assistant Examiner* — Donald M Flores, Jr.
(74) *Attorney, Agent, or Firm* — Schwegman Lundberg & Woessner, P.A.

(57) ABSTRACT

This document discusses, among other things, a microelectronic system including a mold compound having a base layer and a surface layer on the base layer, and a seed layer deposited on the surface layer of the mold compound. The mold compound includes a monomer epoxy resin, a hardener, a filler material, and a polymer interphase material, wherein the polymer interphase material forms the surface layer of the mold compound having an adhesion strength to the seed layer greater than the monomer epoxy resin and hardener alone.

20 Claims, 5 Drawing Sheets

MOLD MATERIAL FOR DIRECT METALLIZATION

TECHNICAL FIELD

This document relates generally to mold material used in semiconductor packaging and more particularly to material formulations for direct metallization on mold material used in semiconductor packaging.

BACKGROUND

Mold compounds have various uses in the microelectronics and semiconductor industry, including as semiconductor packaging material. However, many commonly used mold compounds have poor adhesion strength to metals deposited directly on the surface of the mold compound without additional surface treatments.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
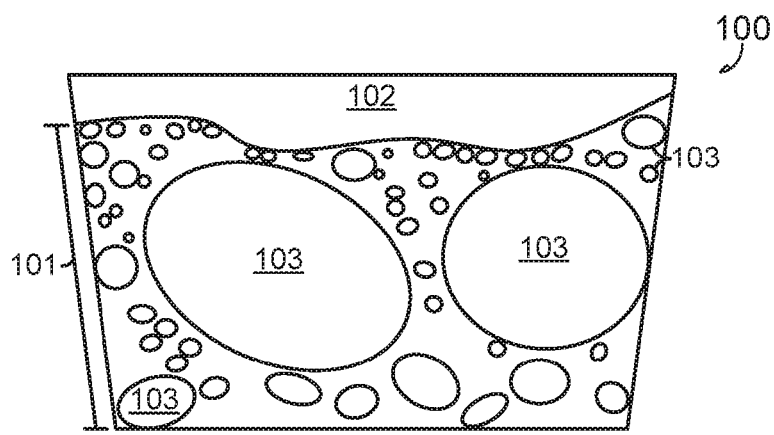
FIG. 1 illustrates generally an example mold compound having a surface layer and a base layer.

Mold Interconnect System (MIS) Ball Grid Array (BGA) (MIS-BGA) packaging architecture is an attractive semiconductor packaging solution due to its relatively low profile (z-height) and low cost, both process and material, as laser drilling is typically not required and the mold compound is typically less expensive than pre-impregnated composite fibers (prepreg, PP) or other build-up material.

Embedded Wafer/Panel-Level Ball Grid Array (BGA) (eWLB/ePLB) packaging is a versatile fan-out wafer/panel-level packaging platform (FOWLP) designed to address the growing mismatch in interconnect gap, higher levels of integration, improved electrical performance and shorter vertical interconnects. The eWLB/ePLB platform provides a more space-efficient package design enabling a smaller footprint, higher density input/output (IO) and lower package profiles than is possible with laminate or flip chip semiconductor packages.

One of the key process steps in an MIS-BGA or an ePLB/eWLB build-up is forming a seed layer or direct metallization on a mold compound. Traditional mold compounds are heavily loaded with filler, and specifically designed to have release agents that migrate to the surface during cure to enable release of the mold compound from the mold, each reducing adhesion of the seed layer to the surface of the cured mold compound. Specific compression molding compounds also form an interaction layer with the adhesives several micrometers thick that further degrades adhesion of the seed layer to the mold compound. Accordingly, in such processes, the surface of the mold compound is typically treated prior to seed layer formation to increase adhesion of the seed layer to the mold compound. However, such surface treatment typically requires additional processing and equipment, increasing cost and adding complexity.

Traditional mold compounds consist essentially of a monomer epoxy resin, a hardener, and a filler material. The present inventors have recognized, among other things, a mold compound including polymer interphase material that forms a surface layer having improved seed layer adhesion with traditional processes, without requiring additional surface treatment. In certain examples, the adhesion strength of the mold compound disclosed herein (e.g., cured) to a seed layer is greater than the adhesion strength of a mold compound without the polymer interphase material, or a mold compound consisting of or consisting essentially of a monomer epoxy resin and hardener; or a monomer epoxy resin, a hardener, and a filler material.

The mold compound disclosed herein can have highly polar phenol/amine-based hardeners that enhance adhesion of the mold compound to metal, and can include long-chained polymers containing, for example, amine, ester, or phenolic-group polymers that evolve to the surface of the mold compound during cure, as polyimides, phenoxy resins, etc. The molecular weight difference between the epoxy-hardener mix and the long-chain polymers can allow phase separation of the long-chain polymer during cure, precipitating or phase-separating, forming a surface layer that provides enhanced adhesion to seed layers deposited using traditional processes, such as electroless (E-less) or sputter deposition, without requiring special surface treatments.

However, if desired, an optional simple plasma etch of a top surface of the mold compound can be used to further improve adhesion of the seed layer to the mold compound. The simple plasma etch is much simpler and cheaper than more costly wet surface treatments. However, using the mold compound disclosed herein, the simple plasma etch is not required for enhanced adhesion strength.

FIG. 1 illustrates generally an example mold compound (cured) 100 including a base layer 101 and a surface layer 102 on the base layer 101. The mold compound can include a monomer epoxy resin, a hardener, a filler material 103, and a polymer interphase material. The base layer 101 can include, or consist essentially of, for example, a majority of the filler material 103, the monomer epoxy resin, and the hardener. The polymer interphase material can form the surface layer 102 of the example mold compound 100, having an increased adhesion strength to a seed layer deposited on a top surface of the surface layer 102 of the mold compound 100 in contrast to a traditional mold compound, described above, without the polymer interphase material. In certain examples, the polymer interphase material can include a long-chain polymer, such as polyetherimide.

The monomer epoxy resin can include at least one of biphenyl epoxy or epoxy novolac. The hardener can include an amine hardener or a phenol hardener, including biphenyl diamine, phenol novolac, etc. The filler material can include silica, or one or more other filler material, e.g., having a diameter between 1 and 75 microns. In certain examples, the example mold compound can include an adhesion promoter, such as a silane adhesion promoter.

The base layer 101 of the example mold compound 100 can include a substantial majority or all of the filler material 103 and, in certain examples, can have a thickness between 5 and 100 microns. The surface layer 102 can have a thickness between 50 nanometers and 5 microns. In other examples, depending on materials and the desired configuration, the ranges can include one or more other values. The example mold compound 100 of FIG. 1, such as the filler material 103 location and amount, etc., is illustrative, and not restrictive, and can vary depending on the materials used, etc.

In an example, during the curing process of the example mold compound 100, phase separation between the monomer epoxy resin and hardener and the polymer interphase material (e.g., long-chain polymer interphase material) can form the surface layer 102 consisting essentially of the polymer interphase material, as well as, in certain examples, a portion of the epoxy resin, separate from, above, but coupled to the base layer 101. In certain examples, the base layer 101 forms with a substantial majority or all of the filler material 103, and a majority of the epoxy resin and hardener.

In contrast, most traditional mold compounds are specifically designed to limit phase separation, unless, for example, using a wax or other material to assist in removal of a cured mold compound from a mold chase. Whereas, in the mold compound described herein, a relatively large molecular weight polymer (e.g., a pre-polymerized resin, etc.) can be added to the mold compound to come out during cure creating an interphase layer. Depending on layer thickness, the peel strength (PS) of the interphase material can range between 0.4 and 0.7 kg/cm, higher than traditional mold compounds without surface treatments.

Table 1, below, illustrates generally example mold compound components.

TABLE 1

Example Mold Compound Components

| Example Components | Typical Ratios (Wt %) | Compounds |
|---|---|---|
| Matrix | 1-10% | Epoxy Resins |
| Hardener | 1-10% | Amines, Anhydrides, Phenols |
| Fillers | 60-90% | Silica, Al2O3 |
| Adhesion Promoters | <1% | Silane Coupling Agents |
| Release agents | <1% | Wax or None for compression mold compound |
| Interphase agents, e.g., to improve adhesion | 1-2% | Polyimides; Polyetherimides; Polyacetal Resins; or other resins that phase separate to surface during cure of mold compound |

Table 2, below, illustrates generally example mold compound formulations.

TABLE 2

Example Mold Compound Formulation

| Example Formulation | Compound | Composition |
|---|---|---|
| Epoxy Resin 1 | BiPhenyl Epoxy | 30% of mol fraction of epoxy |
| Epoxy Resin 2 | Epoxy Novolac; Epoxy Resin | 70% of mol fraction of epoxy |
| Hardener 1 | Biphenyl Diamine | 100% of mole fraction of hardener |
| Filler | Fused Synthetic Silica | 80% wt of total formulation |
| Adhesion Promoter | Amino Silane | <1% wt of total formulation |
| Interphase Agent | Polyetherimide | <1% wt of total formulation |

FIGS. 2-11 illustrate generally an example process flow to manufacture a MIS-BGA semiconductor package using the mold compound described herein.

Figure 2:
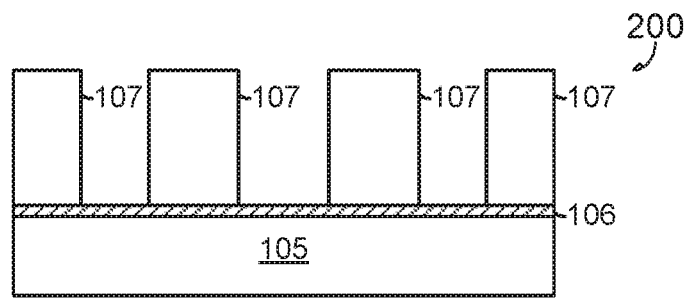
FIGS. 2-11 illustrate generally an example process flow to manufacture a MIS-BGA semiconductor package using the mold compound described herein.

FIG. 2 illustrates generally an example cross section 200 including a carrier substrate 105, a seed layer 106 (e.g., copper (Cu), nickel (Ni), titanium (Ti), etc.) laminated or deposited on a top surface of the carrier substrate 105, and dry film resist (DFR) 107 can be patterned (e.g., laminated, exposed, developed, etc.) to form a template on a top surface of the seed layer 106.

Figure 3:
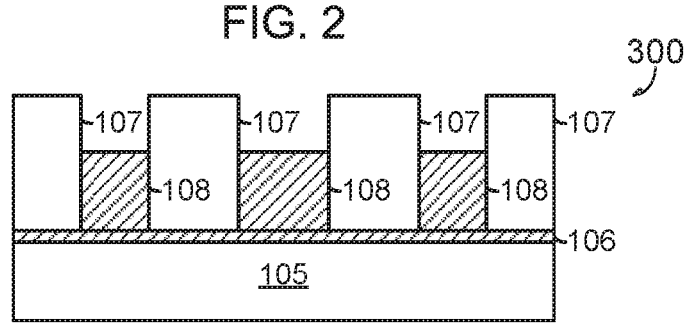
Figure 4:
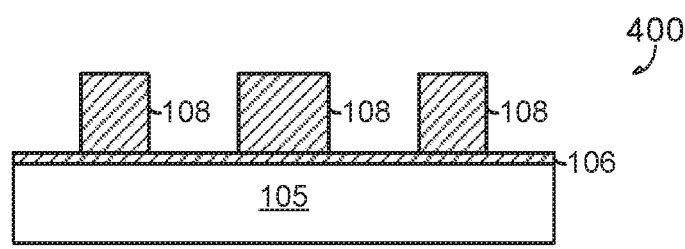

FIG. 3 illustrates generally an example cross section 300 including a first metal 108 (e.g., the same metal as the seed layer 106, such as Cu, etc.) deposited (e.g., electrolytic Cu plating, etc.) on the exposed sections of the seed layer 106 between the remaining portions of the patterned DFR 107. After the first metal 108 is deposited, the DFR 107 can be removed (e.g., using developer, stripper, etc.). FIG. 4 illustrates generally an example cross section 400 with the DRF 107 removed.

Figure 5:
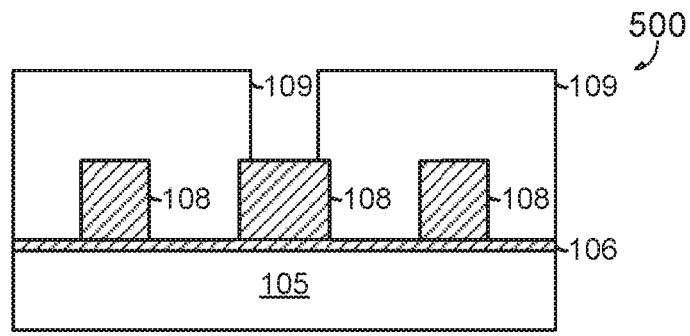

FIG. 5 illustrates generally an example cross section 500 including a second DFR 109 patterned to form a template on the seed layer 106 and the first metal 108. In an example, the second DFR can be patterned to expose at least a portion of the first metal 108.

Figure 6:
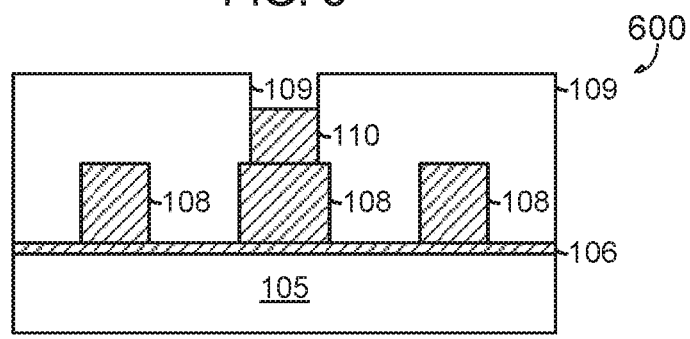
Figure 7:
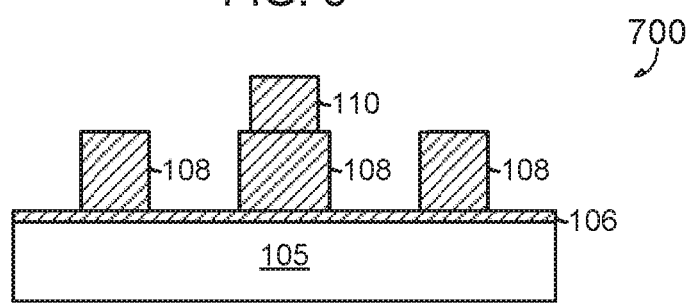

FIG. 6 illustrates generally an example cross section 600 including a second metal 110 (e.g., the same metal as the first metal 108, such as Cu, etc.) deposited (e.g., electrolytic Cu plating, etc.) on a top surface of the exposed first metal 108. In an example, the second metal 110 can be used as a via, or an electrical connection from the first metal layer to a top surface or another layer of a finished MIS-BGA semiconductor package, etc. After the second metal 110 is deposited, the second DFR 109 can be removed (e.g., using developer, stripper, etc.). FIG. 7 illustrates generally an example cross section 700 with the second DFR 109 removed.

Figure 8:
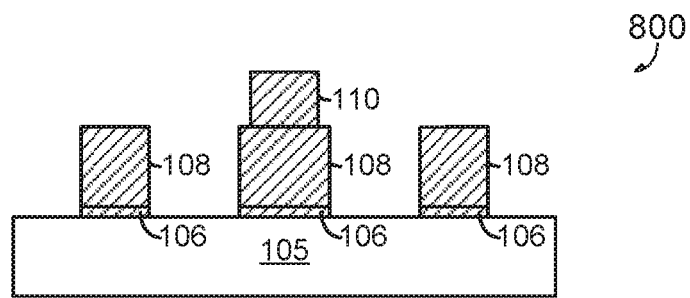

FIG. 8 illustrates generally an example cross section 800 with the exposed portions of the first seed layer 106 (e.g., not covered by the first metal 108) removed (e.g., etched), isolating the remaining metal portions.

Figure 9:
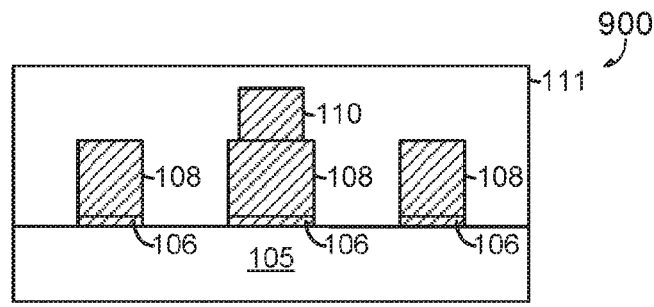
Figure 10:
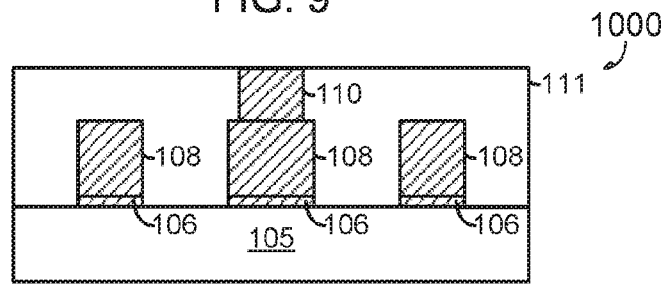

FIG. 9 illustrates generally an example cross section 900 including a mold compound 111, such as described above, disposed over the remaining metal. FIG. 10 illustrates generally an example cross section 1000 with a top portion of the mold compound 111 ground down to expose a top surface of the second metal 110. Following this step, with traditional mold compounds, the remaining surface of the mold compound 111 would have to be treated, such as using a wet etch or one or more other surface treatment options. However, because of the mold compound 111 disclosed herein, this step can be avoided altogether.

Figure 11:
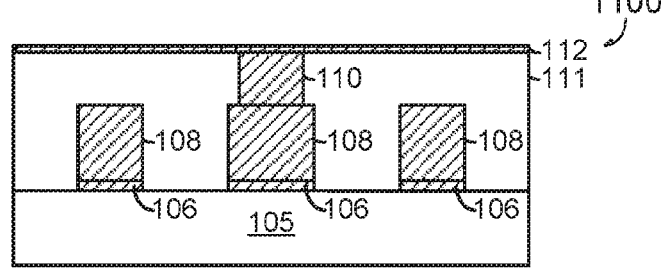
Figure 12:
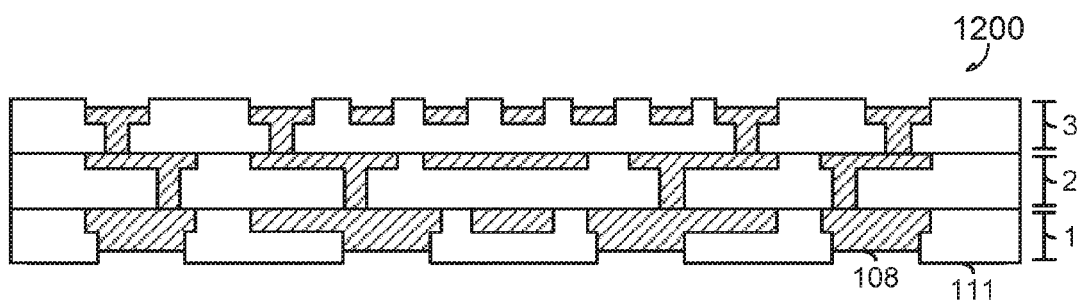
FIG. 12 illustrates generally an example multi-layer molded substrate including first, second, and third layers that can be built using the process flow described in FIGS. 2-11 and the mold compound described herein.

FIG. 11 illustrates generally an example cross section 1100 including a second seed layer 112 deposited (e.g., Electro-less or sputter deposition, etc.) on a top surface of the mold compound 111. A plasma etch of the top surface of the mold compound 111 prior to the second seed layer 112 deposition can be optionally performed, if desired or necessary. In certain examples, one or more additional layers can be added, similar to the process flow described in FIGS. 2-11. The carrier substrate 105 can be etched/separated and First- or Second-Level Interconnect (FLI/SLI) bumping can be added, creating a 2 or more layer MIS-BGA substrate. FIG. 12 illustrates generally an example three-layer MIS-BGA substrate including first, second, and third layers 1, 2, 3, conductive material (e.g., a first metal 108), and a mold compound (e.g., a mold compound 111), such as described above with respect to FIGS. 1-11.

FIGS. 13-22 illustrate generally an example process flow to manufacture an ePLB (Embedded Panel-Level BGA) semiconductor package (e.g., with bumpless die) using the mold compound described herein. The example process flow described herein for the ePLB semiconductor package is similar to that of a eWLB (Embedded Wafer-Level BGA) semiconductor package; except the latter uses wafer-based infrastructure.

Figure 13:
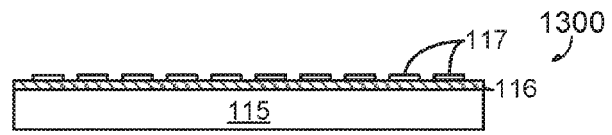
FIGS. 13-22 illustrate generally an example process flow to manufacture an ePLB (Embedded Panel-Level BGA) semiconductor package using the mold compound described herein.

FIG. 13 illustrates generally an example cross section 1300 including a carrier substrate 115 (e.g., a reusable stainless steel carrier, or one or more other carrier substrates), an adhesive layer 116 (e.g., thermal release tape, such as REVALPHA, etc.) disposed (e.g., laminated) on a top surface of the carrier substrate 115, and one or more dies 117 bonded on a top surface of the adhesive layer 116.

Figure 14:
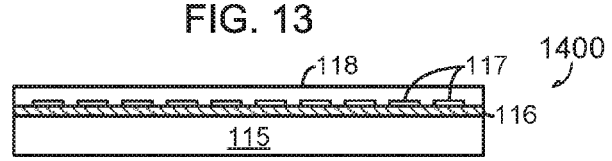

FIG. 14 illustrates generally an example cross section 1400 including a mold compound 118, such as described above, disposed (e.g., molded and cured) over the one or more dies 117 and exposed portions of the top surface adhesive layer 116. Once cured, the mold compound 118 can be released from the carrier substrate 115, and the adhesive layer 116 can be removed (e.g., de-taped), leaving one or more dies 117 embedded in the mold compound 118, such as illustrated in FIG. 15.

Figure 15:
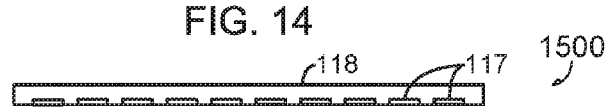

FIG. 15 illustrates generally an example cross section 1500 including a mold compound 118 and one or more dies 117 in the mold compound 118.

Figure 16:
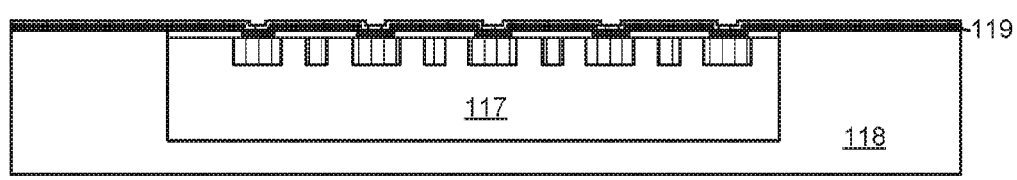

For simplicity, the subsequent figures describe the process flow with a single die. FIG. 16 illustrates generally an example cross section 1600 including a die 117 embedded in a mold compound 118, and a first seed layer 119 deposited on the die 117 and the mold compound 118. With traditional mold compounds, the surface of the mold compound 118 would have to be treated prior to depositing the first seed layer 119, such as using a wet etch or one or more other surface treatment options, adding cost, time, and complexity, and increasing the risk of damage to the die 117. However, because of the mold compound 118 disclosed herein, this step can be avoided altogether, as the mold compound 118 and techniques disclosed herein enable deposition of the seed layer 119 directly on the mold compound 118 with enhanced adhesion. The seed layer 119 can include, among other things, sputter Titanium (Ti) or Copper (Cu), electroless Cu, or one or more other deposited metals.

A plasma etch of the top surface of the mold compound 118 prior to the seed layer 119 deposition can be optionally performed, if desired or necessary. The process steps described in FIGS. 2-11 can be similarly adopted to create the first redistribution layer on the embedded die. Multiple redistribution layers can be created by repeating process flow described in FIGS. 2-11. The multiple redistribution layers can also be created using the traditional HDI substrate build up materials with laser drilled vias or wafer level processes such as those used in eWLB. Once the desired configuration is achieved, a Solder Resist Layer can be laminated, patterned and bumped to create the SLI forming the ePLB package.

Figure 17:
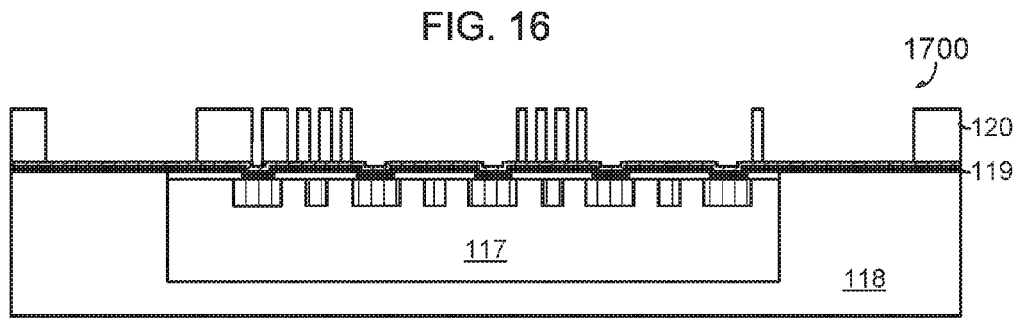

FIG. 17 illustrates generally an example cross section 1700 including a die 117 embedded in a mold compound 118, a first seed layer 119, and dry film resist (DFR) (e.g., a DRF 120) laminated, exposed, and developed on the first seed layer 119.

Figure 18:
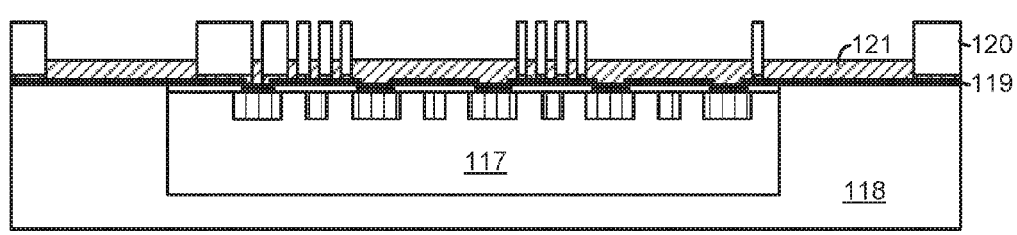

FIG. 18 illustrates generally an example cross section 1800 including a die 117 embedded in a mold compound 118, a first seed layer 119, a DFR 120, and a conductive material 121 deposited on the first seed layer 119 between the remaining portions of the patterned DFR 120. The conductive material can be electroplated (e.g., Cu, etc.) on the first seed layer 119. Following electroplating of the conductive material 121, the DFR 120 can be removed (e.g., stripped), such as illustrated in example cross section 1900 of FIG. 19.

Figure 19:
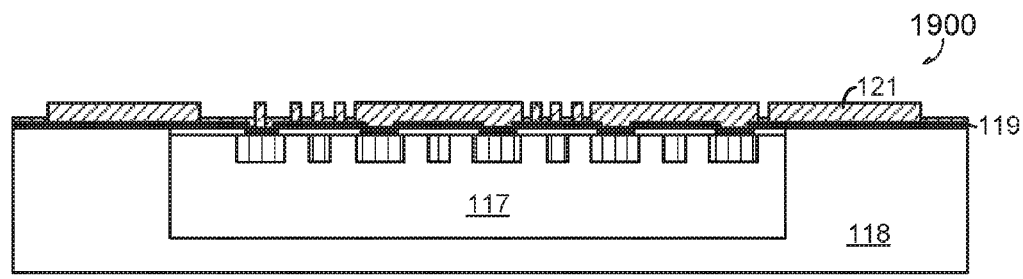

FIG. 19 illustrates generally an example cross section 1900 including a die 117 embedded in a mold compound 118, a first seed layer 119, and a conductive material 121 deposited on the first seed layer 119.

Figure 20:
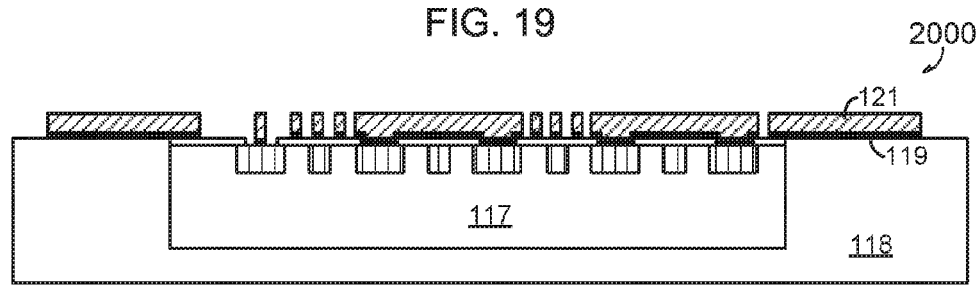

FIG. 20 illustrates generally an example cross section 2000 including a die 117 embedded in a mold compound 118, a first seed layer 119, and a conductive material 121 with a portion of the first seed layer 119 removed (e.g., etched).

Figure 21:
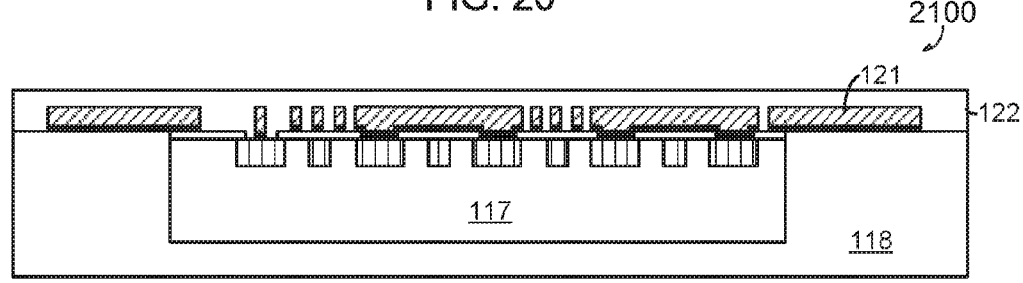

FIG. 21 illustrates generally an example cross section 2100 including a die 117 embedded in a mold compound 118, a conductive material 121, and a layer of solder resist (SR) material 122 laminated over the conductive material 121.

Figure 22:
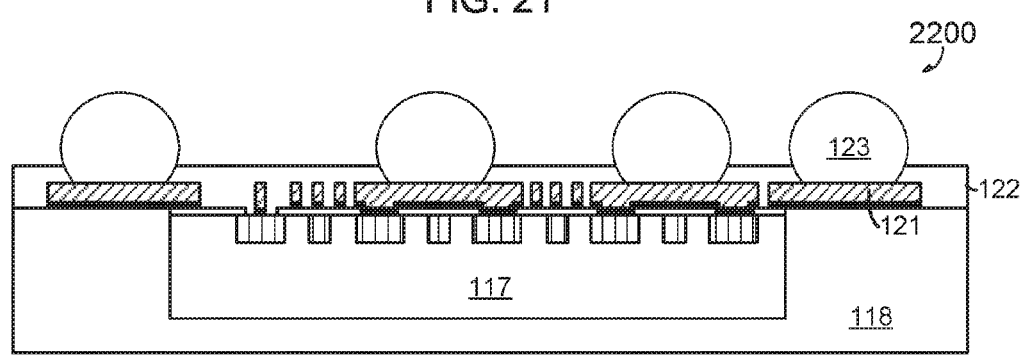

FIG. 22 illustrates generally an example cross section 2200 including a die 117 embedded in a mold compound 118, a conductive material 121, a layer of SR material 122 (e.g., exposed and developed) with one or more solder balls (e.g., a solder ball 123) placed and reflowed to create the SLI (Second Level Interconnect).

Although the example of FIG. 22 illustrates a single-layer ePLB package, this can be extended to a multi-layer ePLB package by adding more redistribution layers using a process flow similar to that described in FIGS. 17-21; build-up materials used for lamination in the redistribution layers followed by SR lamination for the final bumping layer.

Additional Notes And Examples

Example 1 is a microelectronic system, comprising: a mold compound including a base layer and a surface layer on the base layer, the mold compound including: an epoxy resin; a hardener; a filler material; and a polymer interphase material; and a seed layer deposited on the surface layer of the mold compound, wherein the polymer interphase material forms the surface layer of the mold compound having an adhesion strength to the seed layer greater than the epoxy resin and hardener alone.

In Example 2, the subject matter of Example 1 optionally includes, wherein the base layer includes the filler material, and the surface layer includes the polymer interphase material.

In Example 3, the subject matter of any one or more of Examples 1-2 optionally include, wherein the epoxy resin includes a monomer epoxy resin, wherein the hardener includes biphenyl diamine, wherein the filler material includes silica, and wherein the polymer interphase material includes polyetherimide.

In Example 4, the subject matter of Example 3 optionally includes, wherein the monomer epoxy resin includes at least one of biphenyl epoxy or epoxy novolac.

In Example 5, the subject matter of any one or more of Examples 3-4 optionally include, wherein the mold compound includes a silane adhesion promoter.

In Example 6, the subject matter of any one or more of Examples 1-5 optionally include, wherein the hardener includes an amine hardener or a phenol hardener.

In Example 7, the subject matter of any one or more of Examples 1-6 optionally include, wherein the base layer has a thickness between 5 and 100 microns, and the surface layer has a thickness between 50 nanometers and 5 microns.

In Example 8, the subject matter of any one or more of Examples 1-7 optionally include, wherein the polymer interphase material forms the surface layer of the mold compound having an adhesion strength to the seed layer greater than at least one of: a mold compound without the polymer interphase material; a mold compound without the polymer interphase material, and without surface treatment; a mold compound consisting essentially of the epoxy resin and the hardener; a mold compound consisting essentially of the epoxy resin, the hardener, and the filler material; or a mold compound consisting essentially of the epoxy resin, the hardener, and the filler material, without the polymer interphase material.

Example 9 is a mold compound, comprising: an epoxy resin; a hardener; and a filler material; a polymer interphase material; and wherein the polymer interphase material forms a surface layer of the mold compound having an adhesion strength to a seed layer deposited on the surface layer greater than the epoxy resin and hardener alone.

In Example 10, the subject matter of Example 9 optionally includes, including a base layer including the filler material under the surface layer.

In Example 11, the subject matter of Example 10 optionally includes, wherein the base layer includes the filler material, and the surface layer includes the polymer interphase material.

In Example 12, the subject matter of any one or more of Examples 9-11 optionally include, wherein the epoxy resin includes a monomer epoxy resin, wherein the monomer epoxy resin includes at least one of biphenyl epoxy or epoxy novolac, wherein the hardener includes biphenyl diamine, wherein the filler material includes silica, and wherein the polymer interphase agent includes polyetherimide.

In Example 13, the subject matter of Example 12 optionally includes, wherein the monomer epoxy resin includes biphenyl epoxy and epoxy novolac.

In Example 14, the subject matter of any one or more of Examples 9-13 optionally include, wherein the hardener includes an amine hardener or a phenol hardener.

In Example 15, the subject matter of any one or more of Examples 9-14 optionally include, wherein the base layer has a thickness between 5 and 100 microns, and the surface layer has a thickness between 50 nanometers and 5 microns.

In Example 16, the subject matter of any one or more of Examples 9-15 optionally include, wherein the polymer interphase material forms the surface layer of the mold compound having an adhesion strength to the seed layer greater than at least one of: a mold compound without the polymer interphase material; a mold compound without the polymer interphase material, and without surface treatment; a mold compound consisting essentially of the epoxy resin and the hardener; a mold compound consisting essentially of the epoxy resin, the hardener, and the filler material; or a mold compound consisting essentially of the epoxy resin, the hardener, and the filler material, without the polymer interphase material.

Example 17 is a method, comprising: curing a mold compound including: an epoxy resin; a hardener; and a filler material; a polymer interphase material, wherein curing the mold compound includes: forming a surface layer using the polymer interphase material, the surface layer having an adhesion strength greater than the epoxy resin and hardener alone; and forming a base layer under the surface layer, the base layer including the filler material; and depositing a seed layer on the surface layer of the mold compound.

In Example 18, the subject matter of Example 17 optionally includes, wherein forming the surface layer using the polymer interphase material includes forming a surface layer having an adhesion strength to a seed layer greater than at least one of: a mold compound without the polymer interphase material; a mold compound without the polymer interphase material, and without surface treatment; a mold compound consisting essentially of the epoxy resin and the hardener; a mold compound consisting essentially of the epoxy resin, the hardener, and the filler material; or a mold compound consisting essentially of the epoxy resin, the hardener, and the filler material, without the polymer interphase material.

Example 19 is a method, comprising: depositing a mold compound over a conductor, the mold compound including: an epoxy resin; a hardener; and a filler material; a polymer interphase material, wherein the mold compound, once deposited, cures to form a surface layer using the polymer interphase material, the surface layer having an adhesion strength greater than the epoxy resin and hardener alone, and a base layer under the surface layer, the base layer including the filler material; and depositing a seed layer on the surface layer of the mold compound.

In Example 20, the subject matter of Example 19 optionally includes, wherein the surface layer has an adhesion strength to a seed layer greater than at least one of: a mold compound without the polymer interphase material; a mold compound without the polymer interphase material, and without surface treatment; a mold compound consisting essentially of the epoxy resin and the hardener; a mold compound consisting essentially of the epoxy resin, the hardener, and the filler material; or a mold compound consisting essentially of the epoxy resin, the hardener, and the filler material, without the polymer interphase material.

In Example 21, a system or apparatus can include, or can optionally be combined with any portion or combination of any portions of any one or more of Examples 1-20 to include, means for performing any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronic system, comprising:
   a mold compound including a base layer and a surface layer on the base layer, the mold compound including:
     an epoxy resin;
     a hardener;
     a filler material;
     a polymer interphase material; and
     a seed layer deposited on the surface layer of the mold compound,
   wherein the base layer includes the filler material, and the surface layer includes the polymer interphase material, wherein the polymer interphase material forms the surface layer of the mold compound having an adhesion strength to the seed layer greater than the epoxy resin and hardener alone.

2. The system of claim 1, wherein the epoxy resin includes a monomer epoxy resin,
   wherein the hardener includes biphenyl diamine,
   wherein the filler material includes silica, and
   wherein the polymer interphase material includes polyetherimide.

3. The system of claim 2, wherein the monomer epoxy resin includes at least one of biphenyl epoxy or epoxy novolac.

4. The system of claim 2, wherein the mold compound includes a silane adhesion promoter.

5. The system of claim 1, wherein the hardener includes an amine hardener or a phenol hardener.

6. The system of claim 1, wherein the base layer has a thickness between 5 and 100 microns, and the surface layer has a thickness between 50 nanometers and 5 microns.

7. The system of claim 1, wherein the polymer interphase material forms the surface layer of the mold compound having an adhesion strength to the seed layer greater than at least one of:
   a mold compound without the polymer interphase material;
   a mold compound without the polymer interphase material, and without surface treatment;
   a mold compound consisting essentially of the epoxy resin and the hardener;
   a mold compound consisting essentially of the epoxy resin, the hardener, and the filler material; or
   a mold compound consisting essentially of the epoxy resin, the hardener, and the filler material, without the polymer interphase material.

8. A mold compound, comprising:
   an epoxy resin;
   a hardener;
   a filler material; and
   a polymer interphase material,
   wherein the polymer interphase material forms a surface layer of the mold compound having an adhesion strength to a seed layer deposited on the surface layer greater than the epoxy resin and hardener alone, and the filler material forms a base layer under the surface layer.

9. The mold compound of claim 8, wherein the base layer includes the filler material, and the surface layer includes the polymer interphase material.

10. The mold compound of claim 8, wherein the epoxy resin includes a monomer epoxy resin,
    wherein the monomer epoxy resin includes at least one of biphenyl epoxy or epoxy novolac,
    wherein the hardener includes biphenyl diamine,
    wherein the filler material includes silica, and
    wherein the polymer interphase material includes polyetherimide.

11. The mold compound of claim 10, wherein the monomer epoxy resin includes biphenyl epoxy and epoxy novolac.

12. The mold compound of claim 8, wherein the hardener includes an amine hardener or a phenol hardener.

13. The mold compound of claim 8, wherein the base layer has a thickness between 5 and 100 microns, and the surface layer has a thickness between 50 nanometers and 5 microns.

14. The mold compound of claim 8, wherein the polymer interphase material forms the surface layer of the mold compound having an adhesion strength to the seed layer greater than at least one of:

a mold compound without the polymer interphase material;

a mold compound without the polymer interphase material, and without surface treatment;

a mold compound consisting essentially of the epoxy resin and the hardener;

a mold compound consisting essentially of the epoxy resin, the hardener, and the filler material; or a mold compound consisting essentially of the epoxy resin, the hardener, and the filler material, without the polymer interphase material.

15. A mold compound, comprising:
an epoxy resin;
an amine or phenol hardener;
a filler material; and
a polymer interphase material,
wherein the polymer interphase material forms a surface layer of the mold compound having an adhesion strength to a seed layer deposited on the surface layer greater than the epoxy resin and hardener alone.

16. The mold compound of claim 15, wherein the amine or phenol hardener is an amine hardener.

17. The mold compound of claim 15, Therein the amine or phenol hardener is a phenol hardener.

18. The mold compound of claim 15, wherein the filler material forms a base layer under the surface layer.

19. A mold compound, comprising:
a monomer epoxy resin, including at least one of biphenyl epoxy or epoxy novolac;
a hardener, including biphenyl diamine;
a filler material, including silica; and
a polymer interphase material, including polyetherimide,
wherein the polymer interphase material forms a surface layer of the mold compound having an adhesion strength to a seed layer deposited on the surface layer greater than the epoxy resin and hardener alone.

20. The mold compound of claim 19, wherein the monomer epoxy resin includes biphenyl epoxy and epoxy novolac.

* * * * *

UNITED STATES PATENT AND TRADEMARK OFFICE
CERTIFICATE OF CORRECTION

PATENT NO.       : 9,931,820 B2
APPLICATION NO.  : 14/977386
DATED            : April 3, 2018
INVENTOR(S)      : Pietambaram et al.

It is certified that error appears in the above-identified patent and that said Letters Patent is hereby corrected as shown below:

In the Claims

In Column 12, Line 3, in Claim 17, delete "Therein" and insert --wherein-- therefor Signed and Sealed this
Fourth Day of June, 2019

Andrei Iancu
*Director of the United States Patent and Trademark Office*